US006301167B1

(12) United States Patent
Lee et al.

(10) Patent No.: US 6,301,167 B1
(45) Date of Patent: Oct. 9, 2001

(54) APPARATUS FOR TESTING SEMICONDUCTOR MEMORY

(75) Inventors: Ill Young Lee; Sang Sik Lee; Jong Hyun Kim, all of Kyoungki-do; Duk Chun Park, Busan-si; Byung Soo Ham; Byung Koo Ham, both of Kyoungki-do, all of (KR)

(73) Assignee: Silicon Tech Ltd., Kyoungki-do (KR)

( * ) Notice: Subject to any disclaimer, the term of this patent is extended or adjusted under 35 U.S.C. 154(b) by 0 days.

(21) Appl. No.: 09/638,385

(22) Filed: Aug. 12, 2000

(30) Foreign Application Priority Data

Apr. 27, 2000 (KR) .............................................. 2000-22344

(51) Int. Cl.⁷ ...................................................... G11C 7/00

(52) U.S. Cl. ................................ 365/201; 365/51; 365/52

(58) Field of Search ................................. 365/201, 51, 52

(56) References Cited

U.S. PATENT DOCUMENTS 4,890,224 * 12/1989 Fredmont .............................. 364/200
6,067,649 * 5/2000 Goodwin ........................ 365/201 X

* cited by examiner

Primary Examiner—Huan Hoang
(74) Attorney, Agent, or Firm—Roth & Goldman

(57) ABSTRACT

An apparatus for testing a semiconductor memory is disclosed, which includes a power control module for varying an output voltage of the power supply unit and supplying to the semiconductor memory in accordance with a power control signal from a CPU(Central Processing Unit) of the main board, and an interface unit for supplying the power control signal from the CPU of the main board to the power control module, thus implementing an accurate operation state of an actual mounting environment of a semiconductor memory device by varying and supplying a certain voltage supplied from a power supply unit when testing whether a semiconductor memory device is defective or not using a main board of a computer apparatus.

6 Claims, 4 Drawing Sheets

APPARATUS FOR TESTING SEMICONDUCTOR MEMORY

BACKGROUND OF THE INVENTION AND PRIOR ARTS

1. Field of the Invention

The present invention relates to an apparatus for testing a semiconductor memory, and in particular to an apparatus for testing a semiconductor memory which is capable of implementing an accurate operation state under a real mounting environment of a memory device by varying a voltage applied to a memory device which will be tested using a main board of a computer system such as a PC, a net station computer, a server computer, etc.

2. Description of the Background Art

Generally, in an apparatus using a semiconductor memory such as a SDRAM(Synchrous Dynamic Random Access Memory), a RAMBUS DRAM, or a SRAM(Static Random Access Memory), in order to check the characteristic or reliability of an interior circuit after an assembling operation of a device, an assembled device is mounted in a socket, and then the test is performed using a specific equipment for an expensive semiconductor memory test.

However, since the semiconductor memory test apparatus is expensive, the cost for a test of one memory device is increased. Therefore, the product competitive capacity of a company is decreased. In addition, since the memory device is tested using an additional apparatus, not under an actual environment, it is impossible to implement a desired use environment characteristic in a PC main board which is an actual environment for using a memory device.

In order to overcome the above problems, in a semiconductor device fabrication field, recently, a test method using a main board of a computer apparatus such as a PC, a work station or a server which actually uses a semiconductor device is generally used.

In the method using a main board of a computer apparatus, a socket is used for detachably installing a memory module or a unit semiconductor device on a main board. The memory module or unit memory device which will be tested is inserted into the socket, and then the computer apparatus is operated, so that it is possible to test whether the semiconductor device is defective or not.

However, in the above-described method, a voltage(for example, 3V) supplied from a power supply unit of a computer apparatus is directly supplied to a semiconductor memory device(module) which will be tested. The accuracy of the test is decreased under an actual operation environment. Namely, in the case that the voltage supplied thereto is changed, the result of the test may be changed.

SUMMARY OF THE INVENTION

Accordingly, it is an object of the present invention to provide an apparatus for testing a semiconductor memory which overcomes the problems encountered in the conventional art.

It is another object of the present invention to provide an apparatus for testing a semiconductor memory according to a first embodiment of the present invention which is capable of implementing an accurate operation state of an actual mounting environment of a semiconductor memory device by varying and supplying a certain voltage supplied from a power supply unit when testing whether a semiconductor memory device is defective or not using a main board of a computer apparatus.

To achieve the above objects, there is provided an apparatus for testing a semiconductor memory which includes a power control module for varying an output voltage of the power supply unit and supplying to the semiconductor memory in accordance with a power control signal from a CPU(Central Processing Unit) of the main board, and an interface unit for supplying the power control signal from the CPU of the main board to the power control module in an apparatus for testing a semiconductor memory capable of testing whether a semiconductor memory is defective by supplying a certain voltage supplied from a power supply unit to a semiconductor memory after mounting a semiconductor memory into a socket installed on a main board of a computer apparatus.

The power control module includes a power controller for adjusting an outpult voltage of the power supply unit to a certain range level and supplying to the semiconductor memory in accordance with a power control signal from the CPU of the main board, and an over current clamping unit connected between the power controller and the semiconductor memory for clamping an over current.

To achieve the above objects, there is provided an apparatus for testing a semiconductor memory according to a second embodiment of the present invention which includes a power control module for varying a certain voltage of the power supply unit and supplying to the semiconductor memory in accordance with a power control signal from a CPU(Central Processing Unit) of the main board, and an interface unit for supplying the power control signal from the CPU of the main board to the power control module in an apparatus for testing a semiconductor memory capable of testing whether a semiconductor memory is defective by supplying a certain voltage supplied from a power supply unit to a semiconductor memory after mounting a semiconductor memory into a socket installed on a main board of a computer apparatus.

The power control module includes a power controller for adjusting a certain voltage of the power supply unit to a certain range level and supplying to the semiconductor memory in accordance with a power control signal from the CPU of the main board, and an over current clamping unit connected between the power controller and the semiconductor memory for clamping an over current.

The interface unit is one of the types formed of an ISA slot type, a RS232 connector type, a parallel port type, a TCI type, and a USB type.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The apparatus for testing a semiconductor memory according to a first embodiment of the present invention will be explained with reference to the accompanying drawings.

Figure 1:
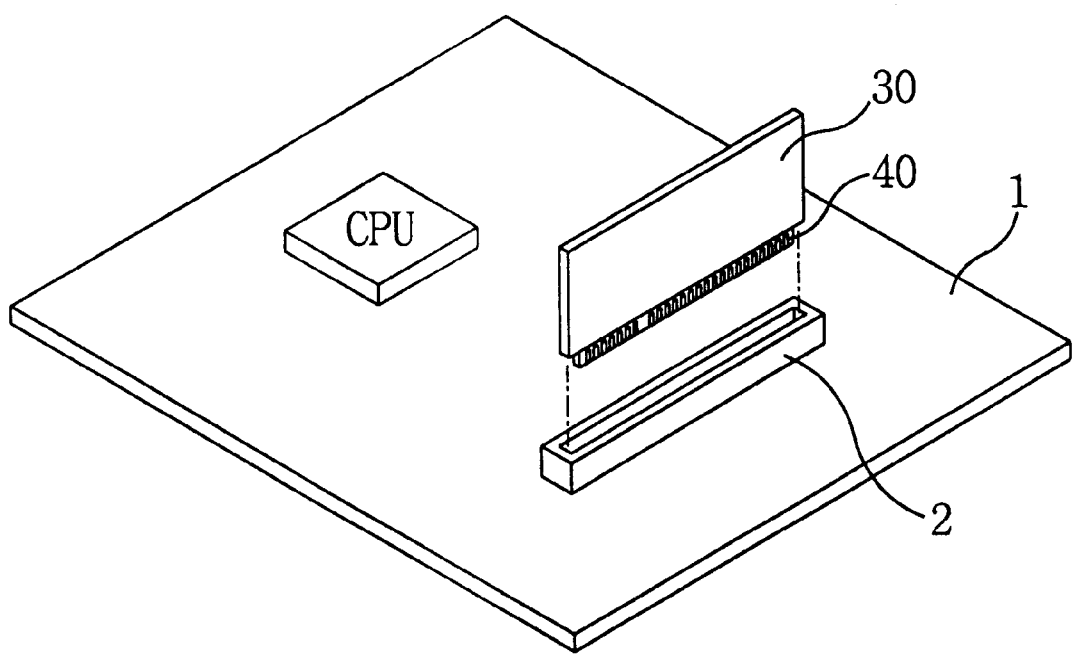
FIG. 1 is a view illustrating the construction of an apparatus for testing a semiconductor memory according to a first embodiment of the present invention.

As shown in FIG. 1, there are provided a power control module 30 for adjusting an output voltage of a power supply unit and outputting to a semiconductor memory(not shown) mounted in a certain socket for a memory test of a main board 1 in according to a control signal from a CPU(Central Processing Unit) of the main board 1 of the computer, and an interface unit 40 for applying a power control signal from the CPU of the main board 1 to the power control module 30.

The power control module 30 is detachable from the socket 2 through the interface unit 40.

Figure 2:
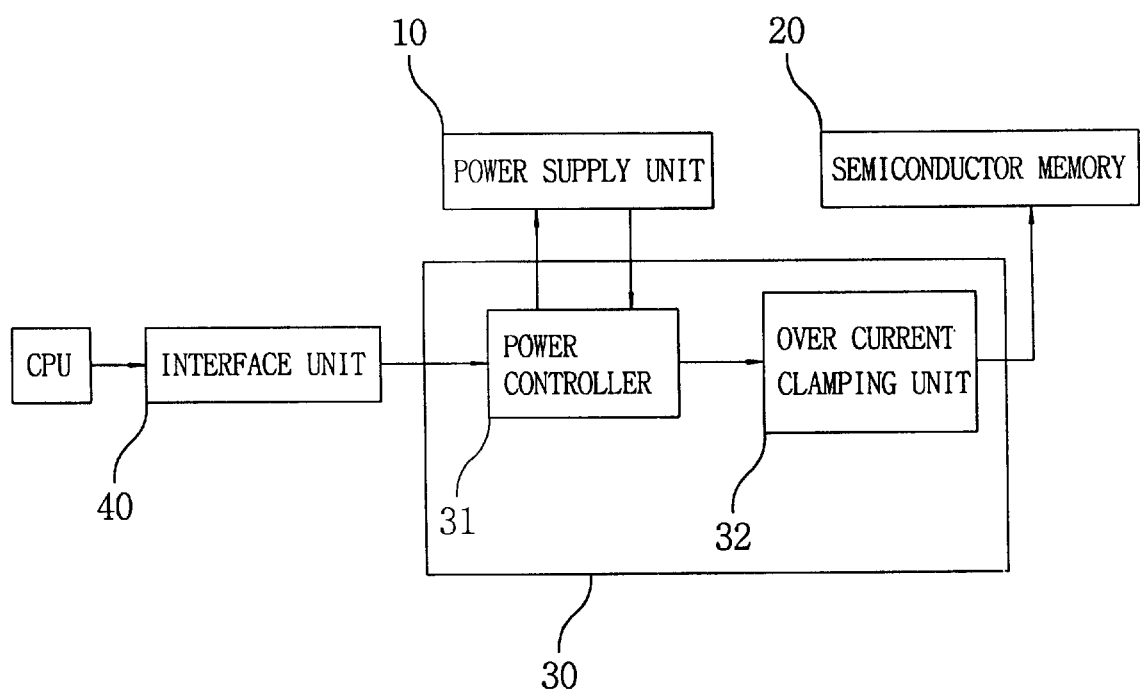
FIG. 2 is a view illustrating a detailed construction of the apparatus of FIG. 1.

FIG. 2 illustrates a detailed construction of the power control module 30.

As shown therein, there are provided a power controller 31 for outputting a certain voltage from the power supply unit 10 by outputting a certain control signal to the power supply unit 10 in accordance with a power control signal inputted from the CPU through the interface unit 40 and supplying a certain voltage to the semiconductor memory 20 installed at the main board 1, and an over-current clamp unit 32 connected with an output terminal of the power controller 31 for protecting a circuit from an over current due to a short circuit or an erroneous insertion of the device.

The power controller 31 includes an A/D converter for adjusting an output voltage of the power supply unit 10. The A/D converter may have a capability of a 8-bit resolution or 12-bit resolution.

The interface unit 40 may be formed of an ISA slot or a RS232 connector or a parallel port or a TCI or a USB in accordance with a connection state.

Figure 3:
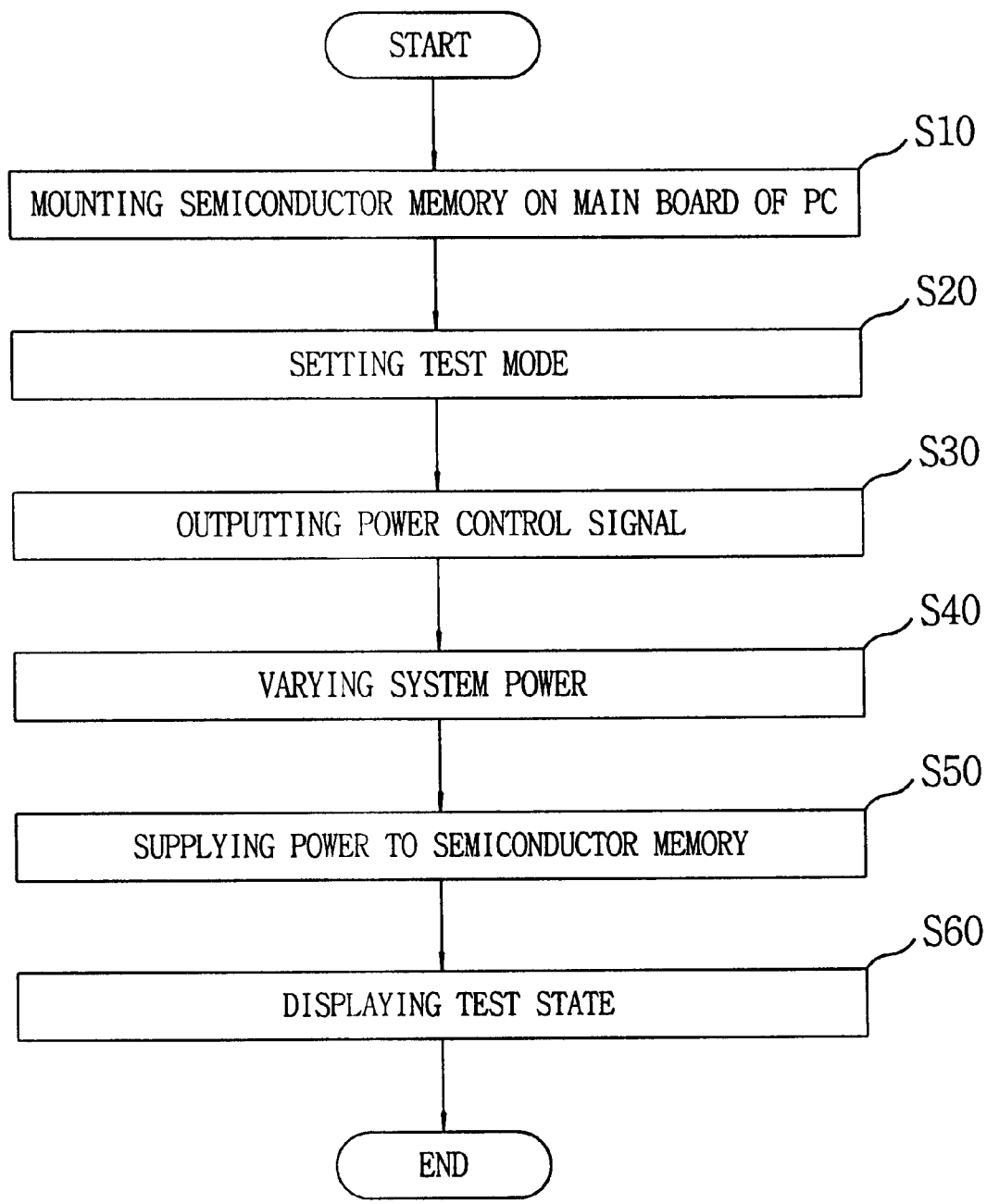
FIG. 3 is a flow chart of a first embodiment of the present invention.

The operation of the first embodiment of the present invention will be explained with reference to the flow chart of FIG. 3.

First, in a step S10, the semiconductor memory 20 which will be tested is installed into a socket for a test of the main board 1, and in a step S20, the test mode is set using a key input unit(not shown), and in a step S30, the test of the semiconductor memory 20 is started, and the CPU of the main board 1 outputs a certain power control signal.

The power control signal is inputted into the power controller 31 through the interface unit 40.

In Steps S40 and S50, the power controller 31 outputs a certain control signal to the power supply unit 10 for thereby outputting a certain voltage. At this time, the power controller 31 outputs a certain voltage to the semiconductor memory 20 using an A/D converter having a certain resolution.

The voltage of 2.9V~3.8V(in the case that the voltage is not set, 3.3V is used in the normal user mode) using the A/D converter is inputted into the semiconductor memory 20. In the case that the A/D converter is an A/D converter of a 8-bit resolution, the voltage range of 2.9V~3.8V is outputted based on the level of $2^8=256$, so that various voltages are outputted to the semiconductor memory 20.

At this time, in the case that a short circuit state occurs or an over current occurs due to an erroneous insertion of the device, the over current is clamped by the over current clamping unit 32 for thereby protecting the circuit.

In a step S60, the user can check a test state by displaying the test state of the semiconductor memory 20 using a monitor(not shown).

In the first embodiment of the present invention, a power control signal is received from the CPU through the interface unit 40 from the power control module 30 and is outputted to the power supply unit 10, and a certain voltage is outputted from the power supply unit 10, so that a certain voltage is applied to the semiconductor memory 20.

In a second embodiment of the present invention, the voltage supplied from the power supply unit is adjusted to a voltage needed for the semiconductor memory in the power control module in accordance with a power control signal applied from the CPU.

Figure 4:
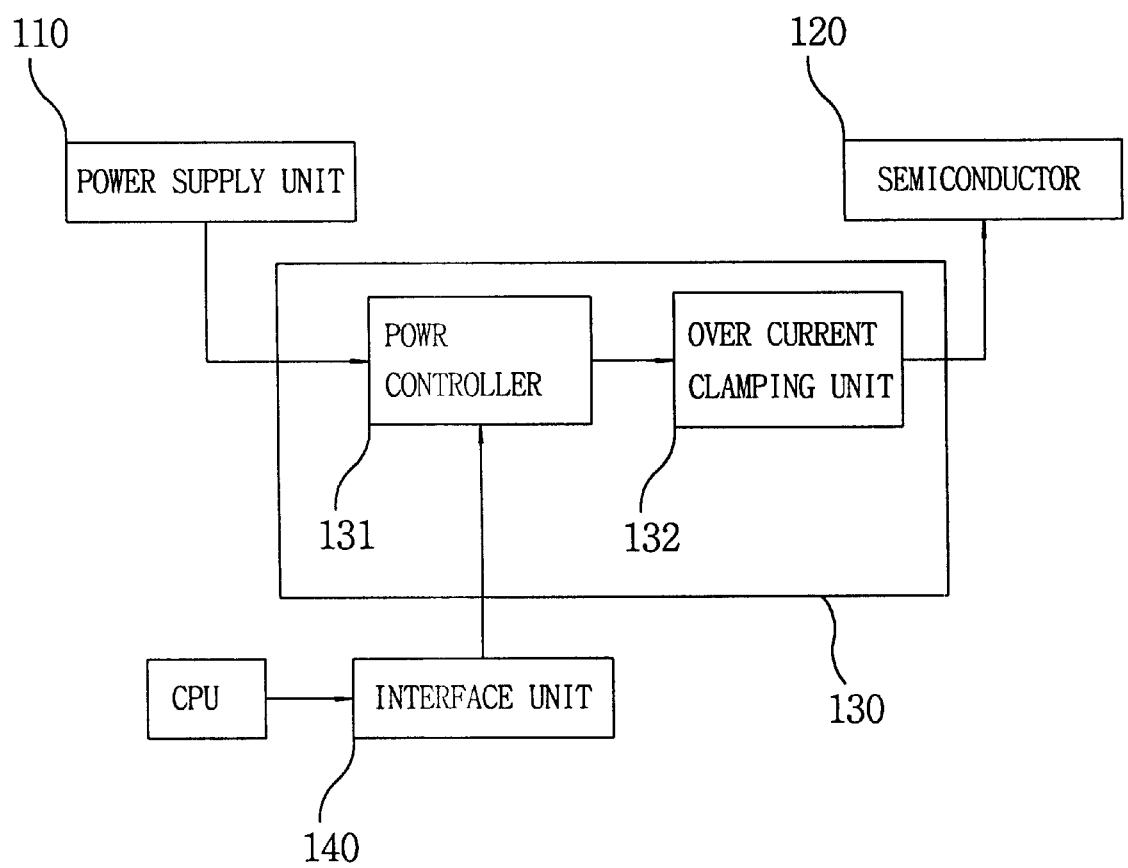
FIG. 4 is a view illustrating the construction of an apparatus for testing a semiconductor memory according to a second embodiment of the present invention.

FIG. 4 is a view illustrating the construction of an apparatus for testing a semiconductor memory according to a second embodiment of the present invention. As shown therein, a power control module 130 is installed between a power supply unit 110 and a semiconductor memory 120.

The power control module 130 receives a voltage control signal from the CPU through the interface unit 140 and adjusts the voltage applied from the power supply unit 110 to correspond with the power control signal for thereby supplying to the semiconductor memory 120.

The power control module 130 includes a power controller 131 varying a certain voltage applied from the power supply unit 110 in accordance with a power control signal inputted from the CPU through the interface unit 140 and outputting to the semiconductor memory 120 installed in a main board of the computer apparatus, and an over current clamping unit 132 connected with an output terminal of the power controller 131 for protecting the circuit from an over current due to a short circuit or an erroneous insertion of the device.

The power controller 131 includes an A/D converter and adjusts a certain voltage supplied from the power supply unit 110 in accordance with a power control signal supplied from the CPU of the main board through the interface unit 140. Here, the A/D converter may have a 8-bit resolution capability or a 12-bit resolution capability in accordance with a construction state of a circuit device.

The interface unit 140 may be formed of an ISA slot or a RS232 connector or a parallel port or a TCI or a USB based on a connection state.

In the apparatus for testing a semiconductor memory according to a second embodiment of the present invention. the voltage inputted from the power supply unit 110 is directly adjusted by the power control module 130 and is outputted to the semiconductor memory 120. Therefore, in this embodiment of the present invention, an external type may be used in the computer apparatus through the interface unit 140 differently from the first embodiment of the present invention.

When a power control signal is inputted into the CPU through the interface unit 140 in the power control module 130, the power controller 131 of the power control module 130 adjusts the voltage inputted from the power supply unit 110 in accordance with the power control signal and applies to the semiconductor memory 120.

At this time, the power controller 131 adjusts the voltage supplied from the power supply unit 110 at a certain level using the A/D converter and outputs the level-adjusted voltage.

For example, in the case of the voltage of 12V is outputted from the power supply unit 110, when a power control signal is inputted so that the voltage of 3V is supplied from the CPU to the semiconductor memory 120, the power controller 131 adjusts the voltage of 12V inputted from the power supply unit 110 to 3V and outputs the voltage of 3V to the semiconductor memory 120.

In the case that an over current occurs due to a short circuit or an erroneous insertion of the device, the over current is clamped by the over current clamping unit 132 for thereby protecting the circuit.

In the second embodiment of the present invention, the same operation as that of the first embodiment of the present invention will be omitted.

As described above, in the present invention, the power of the system is changed in accordance with a power control signal applied from the CPU of the main board when testing the semiconductor memory mounted in the socket for a memory test of the main board of the computer apparatus for thereby implementing an accurate test operation.

Accordingly, in the present invention, it is possible to increase the performance of the test of the semiconductor memory by varying the voltage supplied from the power supply unit of the computer apparatus during a test operation of the memory device using a main board of the computer apparatus and supplies to the memory device. In addition, it is possible to protect the circuit by clamping the over current.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. In an apparatus for testing a semiconductor memory by supplying a voltage supplied by a power supply unit to the semiconductor memory after mounting the semiconductor memory into a socket installed on a main board of a computer apparatus:

a power control module for sending a control signal to the power supply unit for varying an output voltage of the power supply unit and supplying the voltage to the semiconductor memory in accordance with a power control signal from a CPU of the main board; and an interface means for supplying the power control signal from the CPU of the main board to the power control module, wherein said power control module includes:

a power control means for sending the control signal to the power supply unit for adjusting the output voltage of the power supply unit to a certain range level and supplying the adjusted voltage to the semiconductor memory in accordance with the power control signal from the CPU of the main board; and an over current clamping means connected between the power control means and the semiconductor memory for clamping an over current.

2. The apparatus of claim 1, wherein said power control module is formed of a card detachable at a socket of the main board through an interface means.

3. The apparatus of claim 1, wherein said interface means is one of: an ISA slot type, a RS232 connector type, a parallel port type, a TCI type, and a USB type.

4. In an apparatus for testing a semiconductor memory by supplying a voltage supplied by a power supply unit to the semiconductor memory after mounting the semiconductor memory into a socket installed on a main board of a computer apparatus:

a power control module for varying a certain voltage of the power supply unit and supplying the voltage to the semiconductor memory in accordance with a power control signal from a CPU of the main board; and an interface means for supplying the power control signal from the CPU of the main board to the power control module wherein said power control module includes:

a power control means for adjusting a certain voltage of the power supply unit to a certain range level and supplying the adjusted voltage to the semiconductor memory in accordance with the power control signal from the CPU of the main board; and an over current clamping means connected between the power control means and the semiconductor memory for clamping an over current.

5. The apparatus of claim 4, wherein said power control module is an external type with respect to the computer apparatus for receiving the power control signal from the CPU through the interface means.

6. The apparatus of claim 4, wherein said interface means is one of: an ISA slot type, a RS232 connector type, a pallel port type, a TCI type, and a USB type.

* * * * *